(12) United States Patent
Hu (10) Patent No.: US 10,304,794 B2
(45) Date of Patent: May 28, 2019

(54) MANUFACTURING METHOD OF INTEGRATED CIRCUIT PACKAGE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/694,858

(22) Filed: Sep. 4, 2017

(65) Prior Publication Data
US 2017/0365573 A1    Dec. 21, 2017

Related U.S. Application Data

(60) Division of application No. 14/509,395, filed on Oct. 8, 2014, now Pat. No. 9,799,622, which is a
(Continued)

(51) Int. Cl.
*H01L 23/00* (2006.01)
*H01L 23/498* (2006.01)
(Continued)

(52) U.S. Cl.
CPC .......... *H01L 24/25* (2013.01); *H01L 21/6835* (2013.01); *H01L 21/78* (2013.01); *H01L 23/28* (2013.01); *H01L 23/49822* (2013.01); *H01L 23/49833* (2013.01); *H01L 23/5385* (2013.01); *H01L 24/14* (2013.01); *H01L 24/19* (2013.01); *H01L 24/20* (2013.01); *H01L 24/97* (2013.01); *H05K 1/111* (2013.01); *H01L 21/561* (2013.01); *H01L 23/3128* (2013.01); *H01L 25/0655* (2013.01); *H01L 2221/68345* (2013.01); *H01L 2224/16227* (2013.01); *H01L 2224/73253* (2013.01); *H01L 2224/97* (2013.01); *H01L 2924/15174* (2013.01);
(Continued)

(58) Field of Classification Search
None
See application file for complete search history.

(56) References Cited

U.S. PATENT DOCUMENTS

| 6,284,984 B1 * | 9/2001 | Ohyama ................ H05K 1/112 |
| | | 174/260 |
| 7,217,999 B1 | 5/2007 | Honda |
| | (Continued) | |

FOREIGN PATENT DOCUMENTS

| JP | 2001177010 | 6/2001 |
| JP | 2004311912 | 11/2004 |
| WO | 2007129545 | 11/2007 |

*Primary Examiner* — Karen Kusumakar
(74) *Attorney, Agent, or Firm* — JCIPRNET (57) ABSTRACT

A manufacturing method of an integrated circuit package including the following step is provided. A bottom redistribution layer according to IC design rule is fabricated. A top redistribution layer according to PCB design rule and using the first top pads as a starting point is fabricated. The bottom redistribution layer has a plurality of first bottom pads, a plurality of first top pads, at least one dielectric layer and a plurality of vias. Sides and the top of the bottom redistribution layer have interfaces with a lowermost dielectric layer of the top redistribution layer, a bottom surface of the lowermost dielectric layer opposite to the plurality of first top pads is coplanar with a bottom surface of the at least one dielectric layer opposite to the plurality of first top pads and surfaces of the plurality of first bottom pads exposed by the at least one dielectric layer.

7 Claims, 12 Drawing Sheets

Related U.S. Application Data continuation-in-part of application No. 14/308,702, filed on Jun. 18, 2014, now abandoned.

(51) Int. Cl.

| | | |
|---|---|---|
| *H01L 23/538* | (2006.01) | |
| *H01L 21/78* | (2006.01) | |
| *H01L 23/28* | (2006.01) | |
| *H05K 1/11* | (2006.01) | |
| *H01L 21/683* | (2006.01) | |
| *H01L 23/31* | (2006.01) | |
| *H01L 21/56* | (2006.01) | |
| *H01L 25/065* | (2006.01) | |

(52) U.S. Cl.
 CPC .............. *H01L 2924/15311* (2013.01); *H01L 2924/15313* (2013.01); *H01L 2924/15788* (2013.01); *H01L 2924/18161* (2013.01)

(56) References Cited

U.S. PATENT DOCUMENTS

| | | |
|---|---|---|
| 2007/0184604 A1 | 8/2007 | Honda |
| 2007/0256858 A1 | 11/2007 | Kariya et al. |
| 2012/0153445 A1 | 6/2012 | Son et al. |
| 2013/0062777 A1* | 3/2013 | Ogata ..................... H01L 24/05 257/774 |
| 2013/0249075 A1* | 9/2013 | Tateiwa ................ H05K 1/185 257/734 |

* cited by examiner

Figure 3:
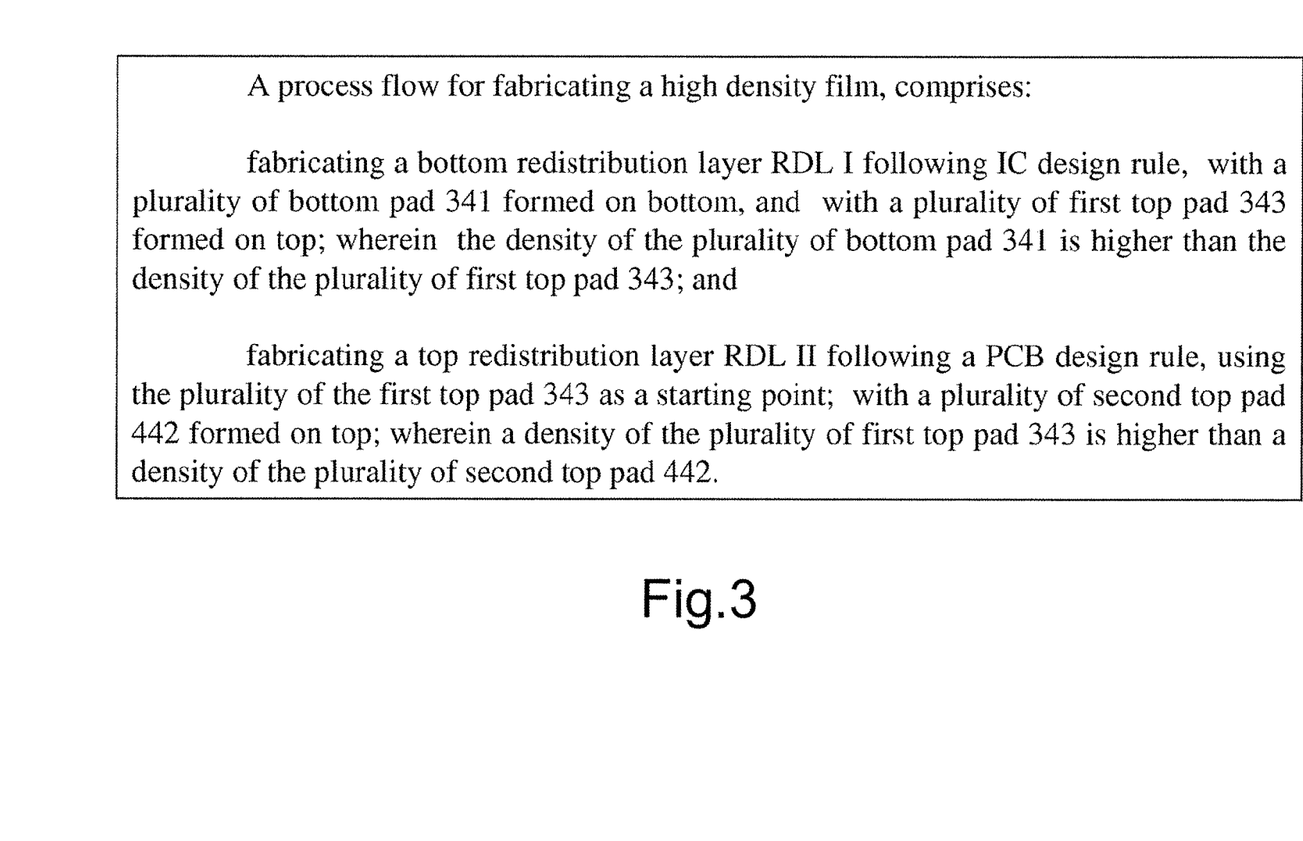
FIG. 3 shows a process flow for fabricating a high density film according to the present invention.

A process flow for fabricating a high density film, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following a PCB design rule, using the plurality of the first top pad 343 as a starting point; with a plurality of second top pad 442 formed on top; wherein a density of the plurality of first top pad 343 is higher than a density of the plurality of second top pad 442.

Fig.3

Figure 4:
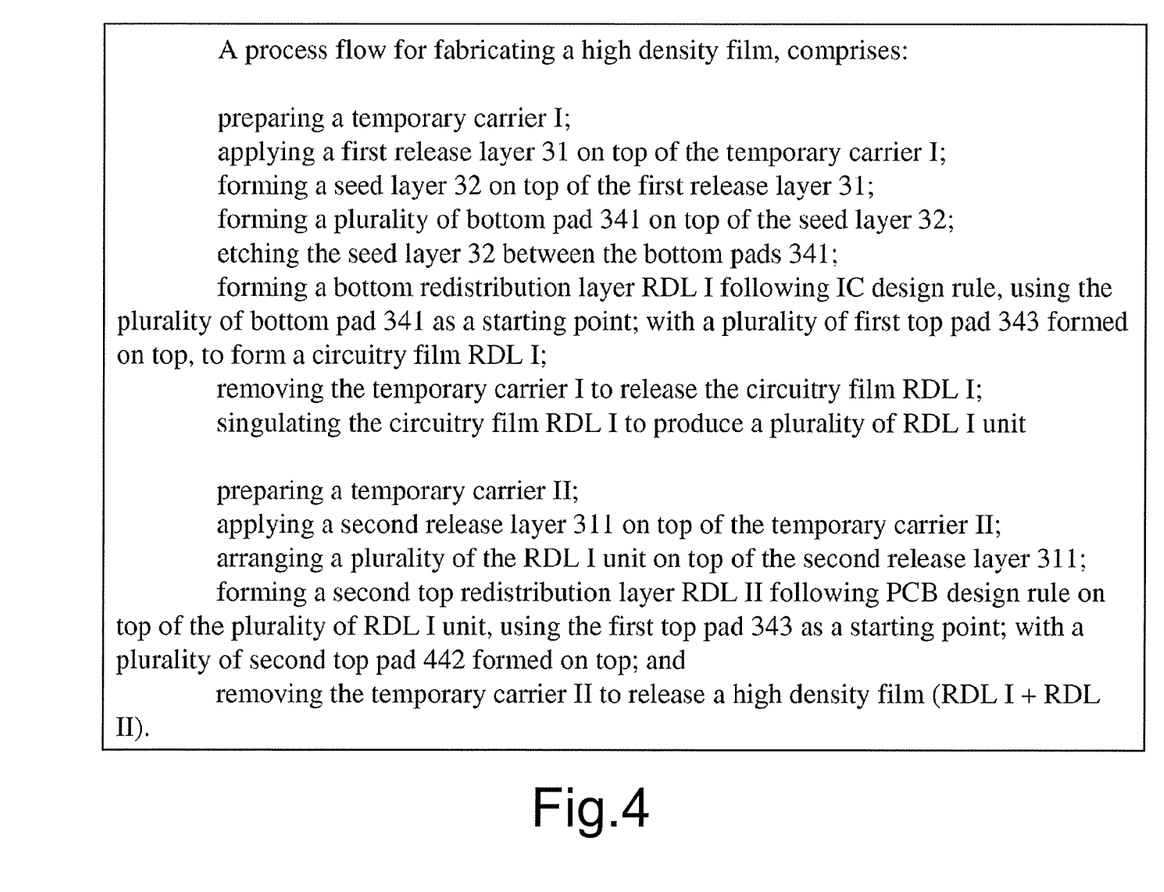
FIG. 4 shows a further process flow for fabricating a high density film according to the present invention.

A process flow for fabricating a high density film, comprises:

preparing a temporary carrier I;
    applying a first release layer 31 on top of the temporary carrier I;
    forming a seed layer 32 on top of the first release layer 31;
    forming a plurality of bottom pad 341 on top of the seed layer 32;
    etching the seed layer 32 between the bottom pads 341;
    forming a bottom redistribution layer RDL I following IC design rule, using the plurality of bottom pad 341 as a starting point; with a plurality of first top pad 343 formed on top, to form a circuitry film RDL I;
    removing the temporary carrier I to release the circuitry film RDL I;
    singulating the circuitry film RDL I to produce a plurality of RDL I unit     preparing a temporary carrier II;
    applying a second release layer 311 on top of the temporary carrier II;
    arranging a plurality of the RDL I unit on top of the second release layer 311;
    forming a second top redistribution layer RDL II following PCB design rule on top of the plurality of RDL I unit, using the first top pad 343 as a starting point; with a plurality of second top pad 442 formed on top; and
    removing the temporary carrier II to release a high density film (RDL I + RDL II).

Fig.4

Figure 5:
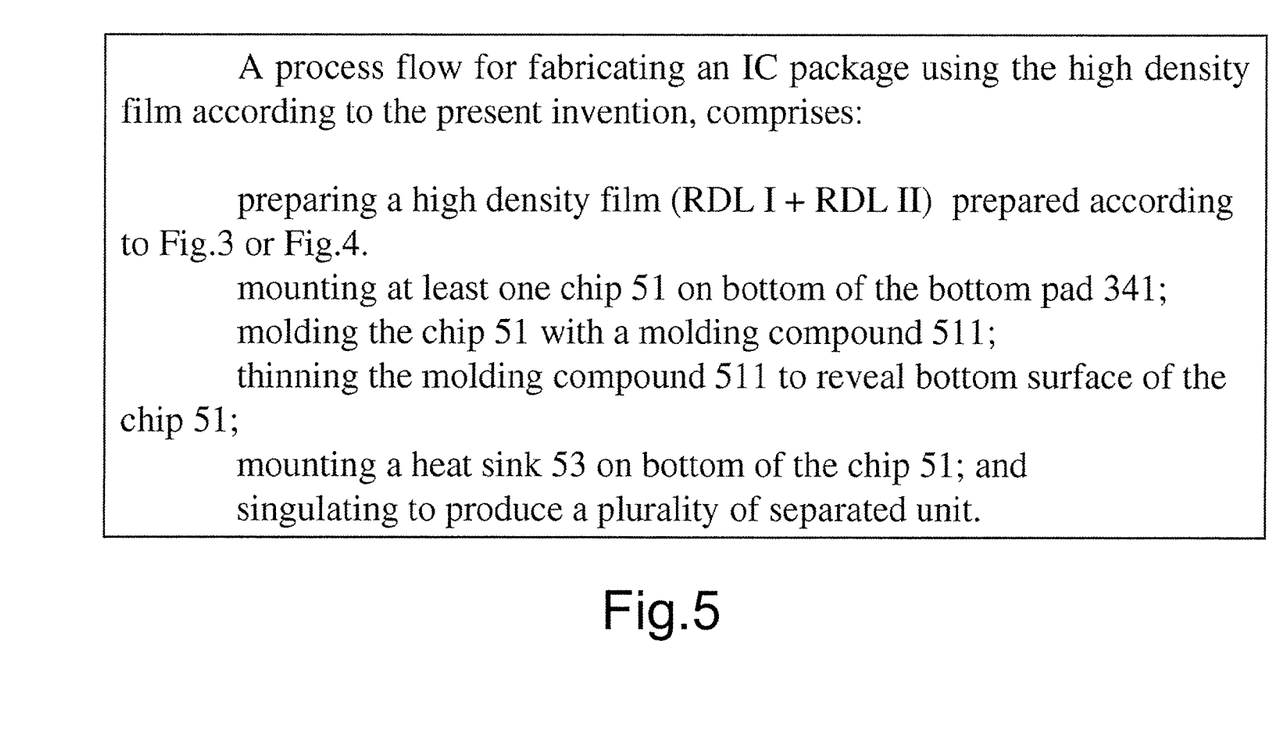
FIG. 5 shows a process flow for fabricating an IC package using the high density film according to the present invention.

A process flow for fabricating an IC package using the high density film according to the present invention, comprises:

preparing a high density film (RDL I + RDL II) prepared according to Fig.3 or Fig.4.

mounting at least one chip 51 on bottom of the bottom pad 341;

molding the chip 51 with a molding compound 511;

thinning the molding compound 511 to reveal bottom surface of the chip 51;

mounting a heat sink 53 on bottom of the chip 51; and singulating to produce a plurality of separated unit.

MANUFACTURING METHOD OF INTEGRATED CIRCUIT PACKAGE

CROSS-REFERENCE TO RELATED APPLICATION

This application is a divisional application of and claims the priority benefit of U.S. application Ser. No. 14/509,395, filed on Oct. 8, 2014, now allowed. The prior U.S. application Ser. No. 14/509,395 is a continuation-in-part application of and claims the priority benefit of U.S application Ser. No. 14/308,702, filed on Jun. 18, 2014. The entirety of each of the above-mentioned patent applications is hereby incorporated by reference herein and made a part of this specification.

BACKGROUND

1. Technical Field

The present invention relates to a high density film for IC package, especially relates to a high density film without having any interposer. A traditional interposer includes such as a semiconductor interposer with through silicon via (TSV) or a glass interposer with through glass via (TGV) embedded therein.

2. Description of Related Art

Figure 1:
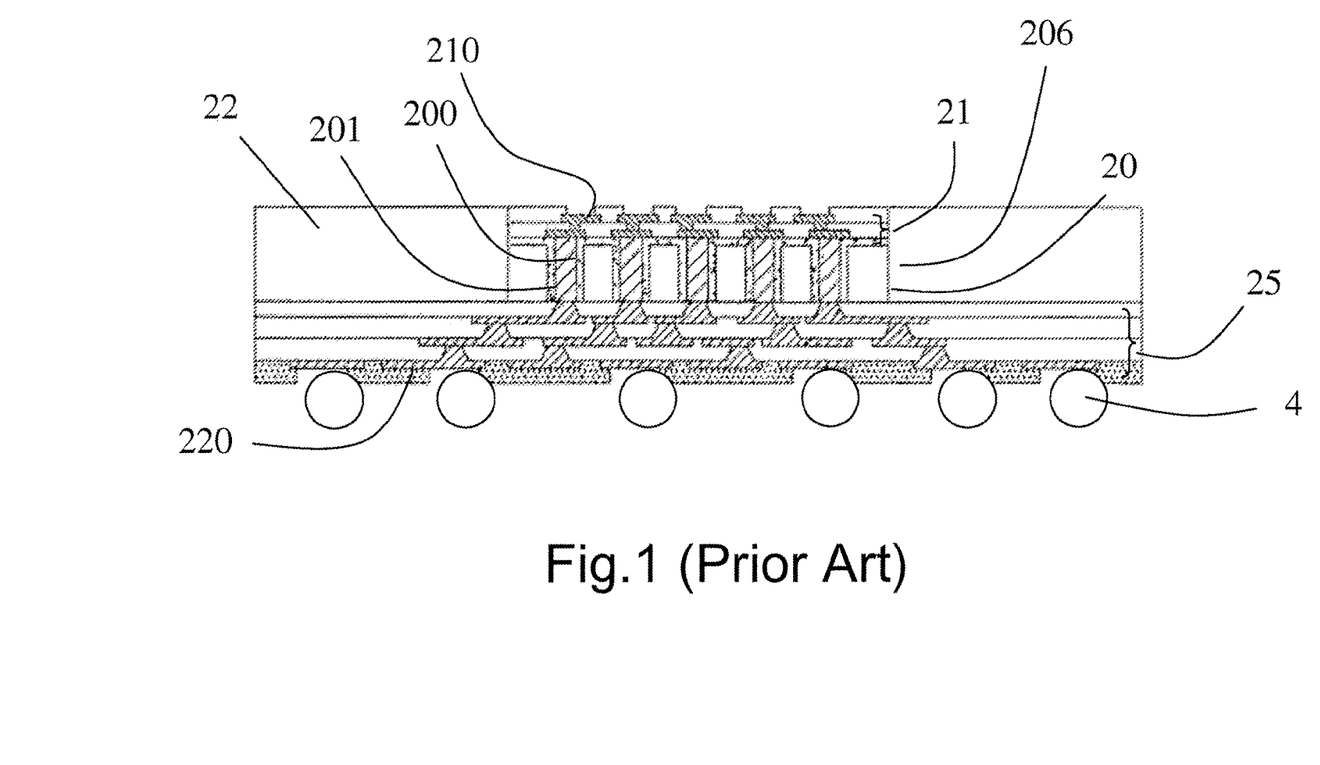
FIG. 1 shows a prior art IC package.

FIG. 1 shows a prior art substrate for IC package

FIG. 1 shows a prior art substrate for IC package disclosed in US 2014/0102777A1 which has an embedded silicon interposer 20. The silicon interposer 20 has four later sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 4 is configured and each solder ball 4 is configured on bottom of a corresponding bottom metal pad 220.

DETAILED DESCRIPTION OF THE INVENTION

FIGS. 2A~2M show a process for fabricating a high density film according to the present invention.

Figure 2A:
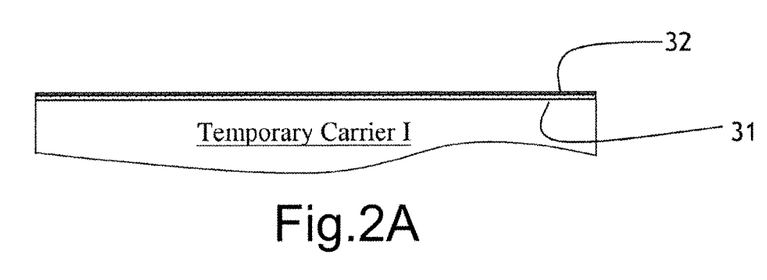
FIGS. 2A~2M show a process for fabricating a high density film according to the present invention.

FIG. 2A shows a temporary carrier I is prepared, a first release layer 31 is applied on top of the temporary carrier I, and a seed layer 32, such Ti/Cu, is formed on top of the first release layer 31.

Figure 2B:
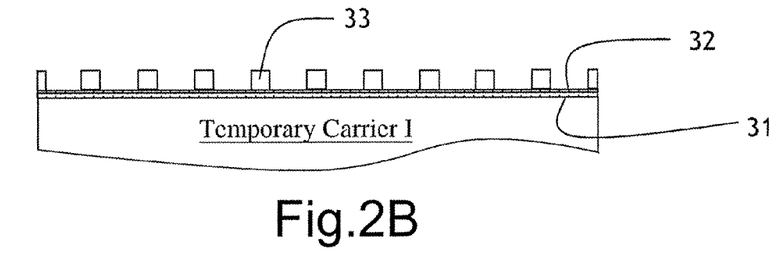

FIG. 2B shows a patterned photoresist 33 is formed on top of the seed layer 32.

Figure 2C:
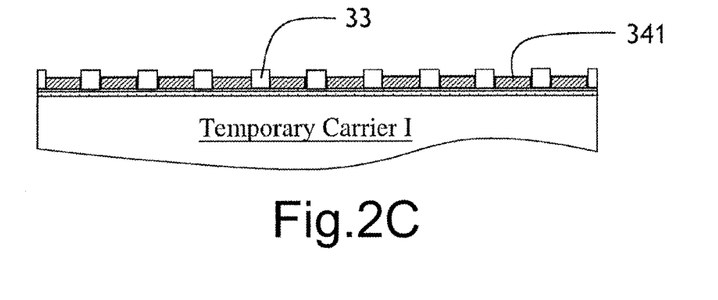

FIG. 2C shows a plurality of bottom pad 341 is formed on top of the seed layer 32.

Figure 2D:
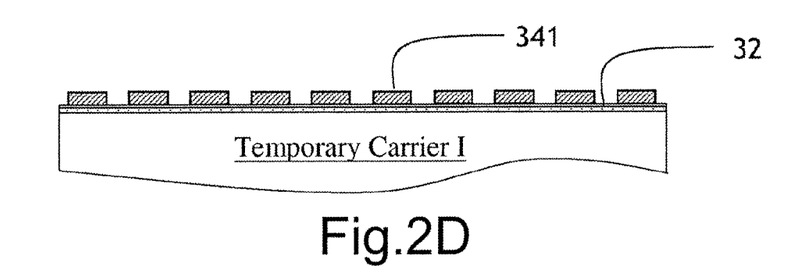

FIG. 2D shows the patterned photoresist 33 is removed and a plurality of bottom pad 341 is left.

Figure 2E:
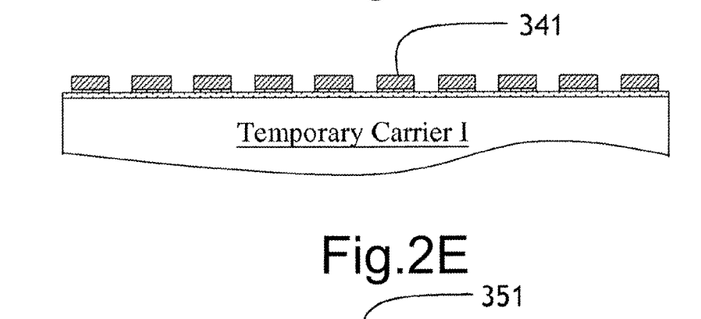

FIG. 2E shows the seed layer 32 between pads 341 are removed.

Figure 2F:
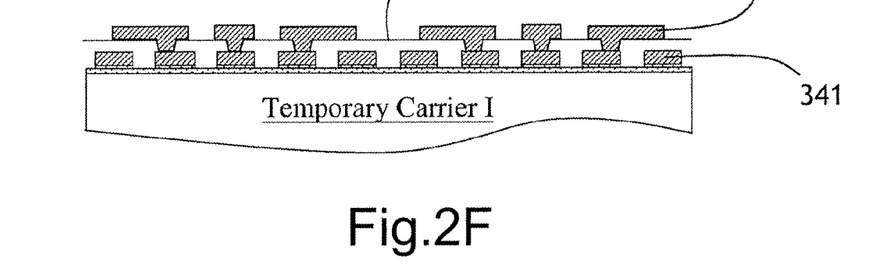

FIG. 2F shows a first redistribution circuitry 342 is formed following IC design rule, using the plurality of bottom pad 341 as a starting point, comprising the steps: a first dielectric layer 351 is applied on top of the bottom pad 341, and then a first redistribution circuitry 342 is formed through traditional technique.

Figure 2G:
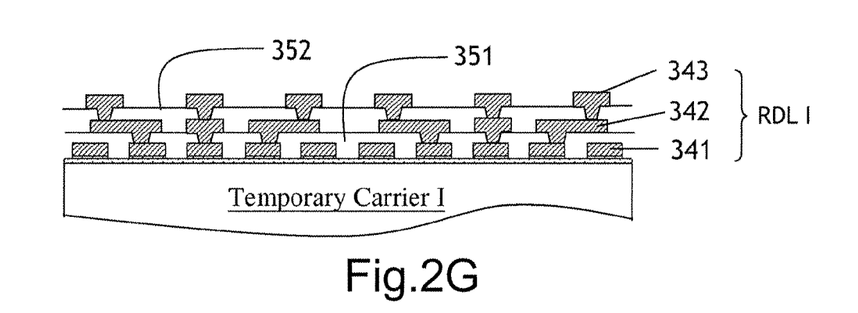

FIG. 2G shows a plurality of first top pad 343 is formed comprising the following steps: a second dielectric layer 352 is applied on top of the first redistribution circuitry 342, a plurality of first top pad 343 is formed through traditional technique. A first redistribution circuitry 342 and a plurality of first top pad 343 are exemplified in this embodiment. The redistribution circuitry layer can be repeatedly processed to even more layers to fan out the circuitry if desired. The bottom pad 341, the first redistribution circuitry 342 and the first top pad 343 are collectively called circuitry film RDL I.

Figure 2H:
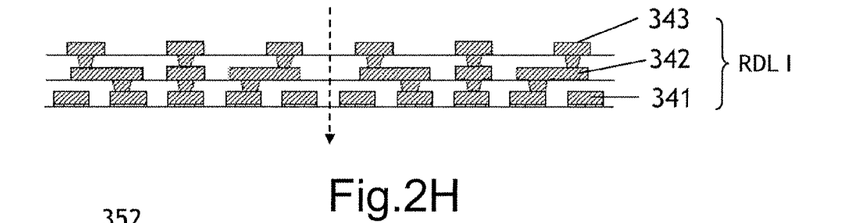

FIG. 2H shows the temporary carrier I is removed to form a circuitry film RDL I. And then a singulating process is performed to produce a plurality of single unit of circuitry film RDL I.

Figure 2I:
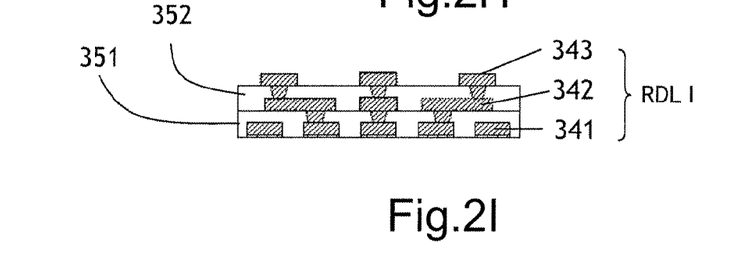

FIG. 2I shows a single unit of circuitry film RDL I.

Figure 2J:
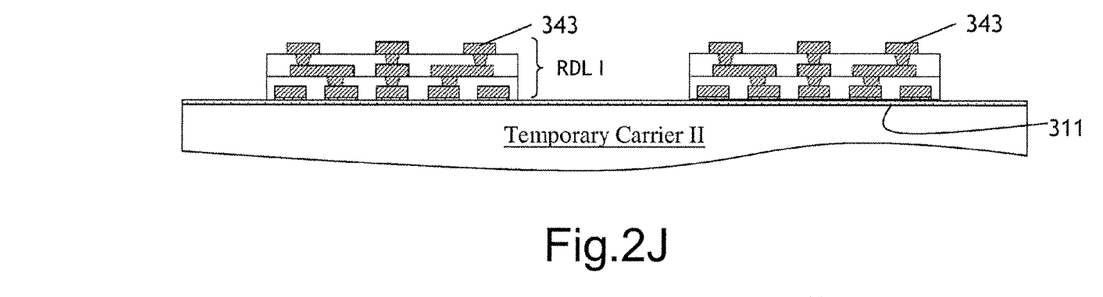

FIG. 2J shows a temporary carrier II is prepared. A second release layer 311 is applied on top of the temporary carrier II. A plurality of circuitry film RDL I is arranged on top of the second release layer 311.

Figure 2K:
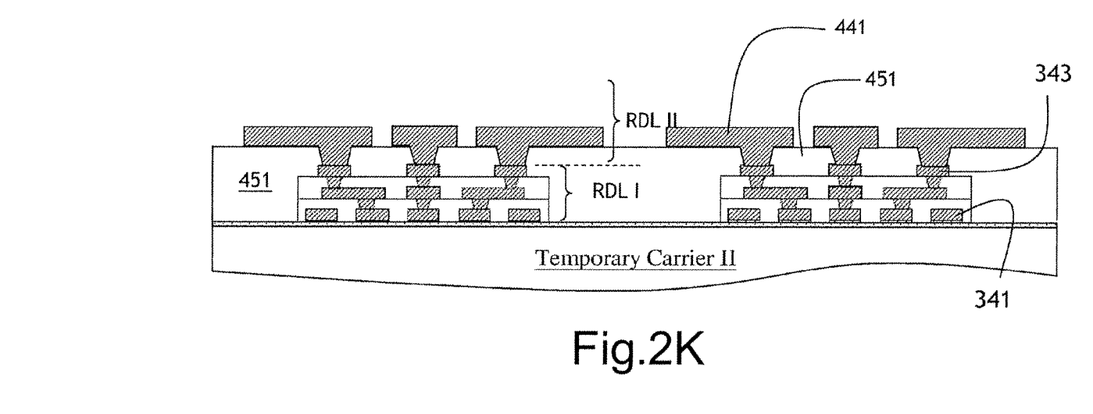

FIG. 2K shows a second redistribution circuitry 441 is formed following PCB design rule, using the plurality of first top pad 343 as a starting point, comprising the steps: a third dielectric layer 451 is applied on top of the circuitry film RDL I, and then a second redistribution circuitry 441 is formed through traditional technique.

The dielectric layer used for PCB process can be one of Ajinomoto build-up films (ABF) or Pre-preg (PP).

Figure 2L:
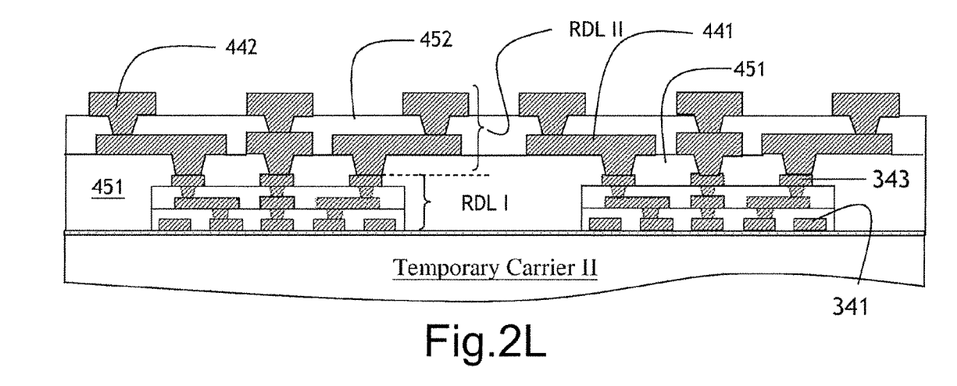

FIG. 2L shows a plurality of second top pad 442 is formed, comprising the steps: a fourth dielectric layer 452 is applied on top of the second redistribution circuitry 441 and the third dielectric layer 451, a plurality of second top pad 442 is formed through traditional technique. A second redistribution circuitry 441 and a plurality of second top pad 442 are exemplified in this embodiment. The redistribution circuitry can be repeatedly processed to even more layers to fan out the circuitry if desired. The redistribution circuitry 441 and the second top pad 442 are collectively called circuitry film RDL II. A high density film (RDL I+RDL II) is framed on top of the second release layer 311.

Figure 2M:
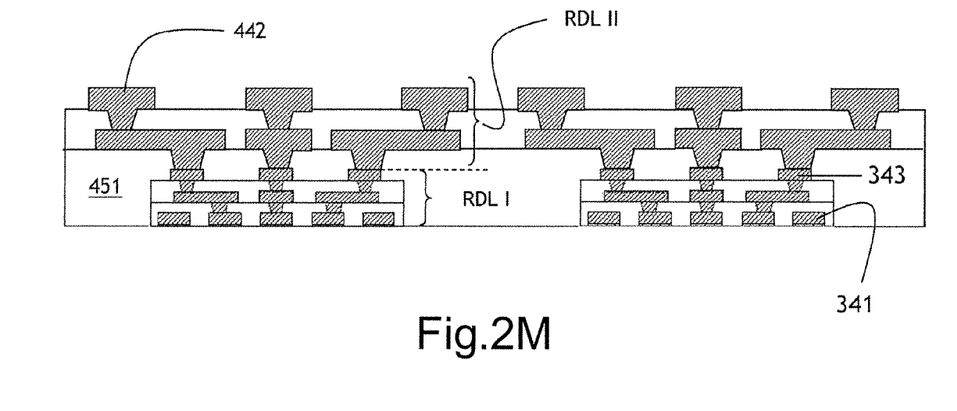

FIG. 2M shows the temporary carrier II is removed, and a high density film (RDL I+RDL II) is released.

FIGS. 2N~2S show a fabricating process for an IC package using the high density film according to the present invention.

Figure 2N:
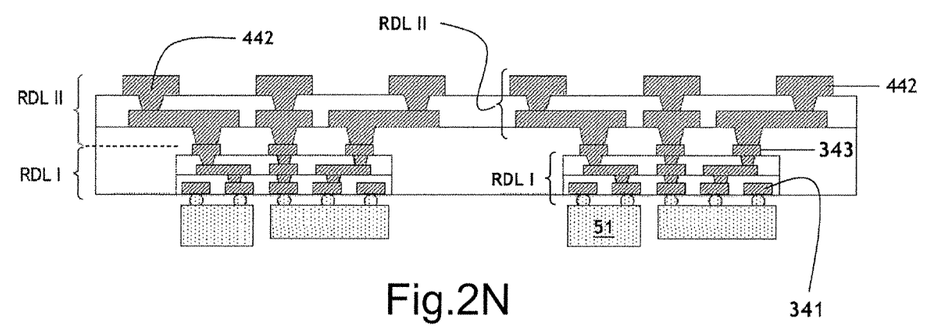
FIGS. 2N~2S show an IC package using the high density film according to the present invention.

FIG. 2N shows at least one chip 51 is mounted on a bottom of the bottom pad 341.

Figure 2O:
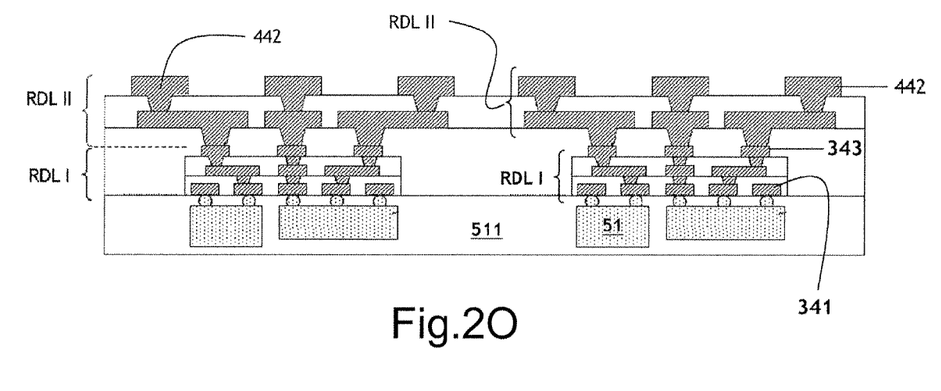

FIG. 2O shows a molding compound 511 is applied to encapsulate the chip or chips 51.

Figure 2P:
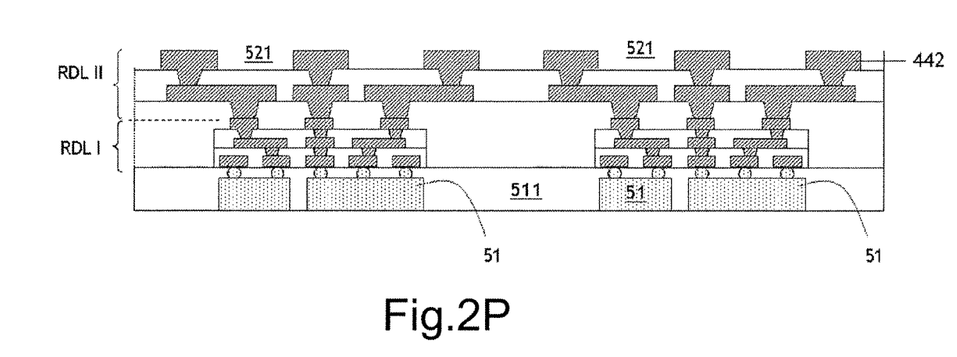

FIG. 2P shows a thinning process is applied onto the molding compound 511 to reveal a bottom surface of the chip 51 for heat dissipation of the chip.

Figure 2Q:
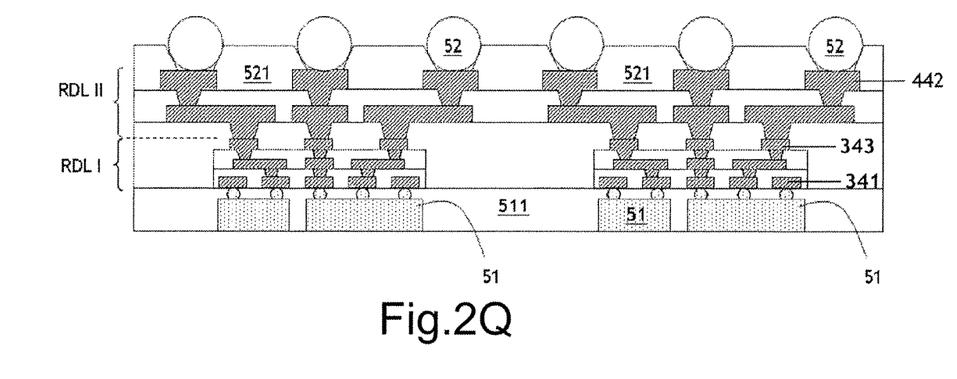

FIG. 2Q shows a dielectric layer 521 is applied between the second top pads 442, and a plurality of solder ball 52 is planted, each solder ball 52 is configured on top of a corresponding top pad 442.

Figure 2R:
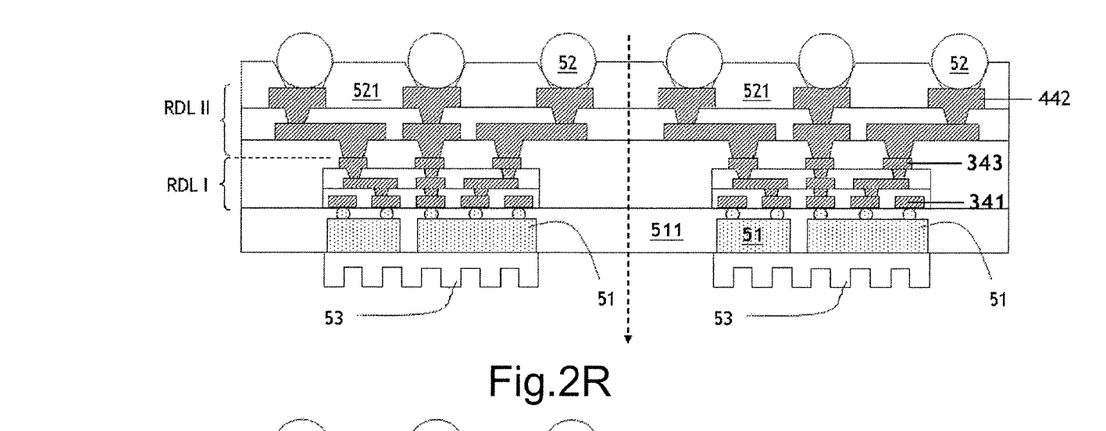

FIG. 2R shows a heat sink 53 is configured on a bottom surface of the chip 51 for further heat dissipation.

Figure 2S:
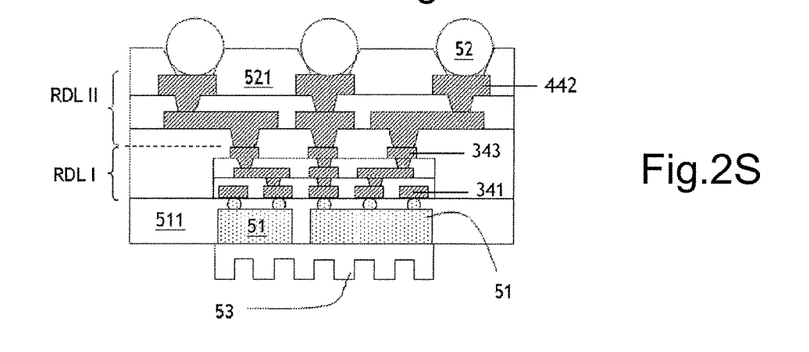

FIG. 2S shows a single unit of the IC package is formed after a singulating process applied on the product of FIG. 2R.

FIG. 3 shows a process flow for fabricating a high density film according to the present invention, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following PCB design rule, using the plurality of the first top pad 343 as a starting point; with a plurality of second top pad 442 formed on top; wherein a density of the plurality of first top pad 343 is higher than a density of the plurality of second top pad 442.

FIG. 4 shows a further process flow for fabricating a high density film, comprises:

preparing a temporary carrier I;

applying a first release layer 31 on top of the temporary carrier I;

forming a seed layer 32 on top of the first release layer 31;

forming a plurality of bottom pad 341 on top of the seed layer;

etching the seed layer between the bottom pads 341;

forming a bottom redistribution layer RDL I following IC design rule, using the bottom pad 341 as a starting point; with a plurality of first top pad 343 formed on top, to form circuitry film RDL I;

removing the temporary carrier I to release the circuitry film RDL I;

singulating the circuitry film RDL I to produce a plurality of RDL I unit;

preparing a temporary carrier II;

applying a second release layer 311 on top of the temporary carrier II;

arranging a plurality of the RDL I unit on top of the second release layer 311;

forming a second top redistribution layer RDL II following PCB design rule on top of the plurality of RDL I unit, using the first top pad 343 as a starting point; with a plurality of second top pad 442 formed on top; and removing the temporary carrier II to release a high density film (RDL I+RDL II).

FIG. 5 shows a process flow for fabricating an IC package using the high density film according to the present invention, comprises:

removing the temporary carrier I to release the bottom redistribution layer RDL I;

singulating the bottom redistribution layer RDL I to produce a plurality of RDL I unit;

preparing a temporary carrier II;

applying a second release layer 311 on top of the temporary carrier II;

arranging a plurality of the RDL I unit on a top of the second release layer 311;

forming a second top redistribution layer RDL II following PCB design rule on top of the plurality of RDL I unit, using the plurality of first top pad 343 as a starting point; with a plurality of second top pad 442 formed on top;

removing the temporary carrier II to release a high density film (RDL I+RDL II);

mounting at least one chip 51 on bottom of the plurality of bottom pad 341;

molding the chip 51 with a molding compound 511;

thinning the molding compound 511 from bottom to reveal the bottom surface of the chip 51;

mounting a heat sink 53 on bottom of the chip 51; and singulating to produce a plurality of separated unit.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A manufacturing method of an integrated circuit (IC) package, the IC package comprising a semiconductor chip mounted on a bottom redistribution layer, the method comprising:

fabricating the bottom redistribution layer according to IC design rule, the bottom redistribution layer having
a plurality of first bottom pads formed on a bottom of the bottom redistribution layer,
a plurality of first top pads formed on a top of the bottom redistribution layer,
at least one dielectric layer between the plurality of first bottom pads and the plurality of first top pads, and
a plurality of vias extending through the at least one dielectric layer, and electrically connecting the plurality of first bottom pads and the plurality of first top pads,
wherein a density of the plurality of first bottom pads is higher than a density of the plurality of first top pads; and fabricating a top redistribution layer according to PCB design rule and using the plurality of the first top pads as a starting point, the top redistribution layer having a plurality of second top pads formed on a top of the top redistribution layer, wherein the density of the plurality of first top pads is higher than a density of the plurality of second top pads, wherein said fabricating the top redistribution layer is performed so that sides and the top of the bottom redistribution layer have interfaces with a lowermost dielectric layer of the top redistribution layer, a bottom surface of the lowermost dielectric layer opposite to the plurality of first top pads is coplanar with a bottom surface of the at least one dielectric layer opposite to the plurality of first top pads and surfaces of the plurality of first bottom pads exposed by the at least one dielectric layer, the sides and the top of the bottom redistribution layer are in direct contact with the lowermost dielectric layer of the top redistribution layer at said interfaces, the top redistribution layer further comprises:
a plurality of second bottom pads, and
a plurality of lowermost vias extending downwardly from the plurality of second bottom pads, the lowermost dielectric layer of the top redistribution layer is under the plurality of second bottom pads, and the lowermost dielectric layer of the top redistribution layer extends continuously downward from the plurality of second bottom pads to the bottom redistribution layer, and embeds therein the plurality of lowermost vias and the plurality of the first top pads.

2. The method according to claim 1, wherein said fabricating the bottom redistribution layer comprises:

preparing a first temporary carrier;

applying a first release layer on top of the first temporary carrier;

forming a seed layer on top of the first release layer;

forming a plurality of first bottom pads on top of the seed layer;

etching the seed layer between the first bottom pads; and forming the bottom redistribution layer according to IC design rule and using the plurality of first bottom pads as a starting point to obtain a circuitry film redistribution layer (RDL).

3. The method according to claim 2, further comprising:

removing the first temporary carrier to release the circuitry film RDL;

singulating the circuitry film RDL to produce a plurality of RDL units;

preparing a second temporary carrier;

applying a second release layer on top of the second temporary carrier;

arranging the plurality of the RDL units on top of the second release layer; and forming the top redistribution layer according to PCB design rule on top of the RDL units; and using the plurality of first top pads as a starting point to obtain a high density film.

4. The method according to claim 3, further comprising:

removing the second temporary carrier to release the high density film; and mounting at least one of the semiconductor chip on bottoms of the plurality of first bottom pads.

5. The method according to claim 4, further comprising:

encapsulating the semiconductor chip with a molding compound; and thinning the molding compound to reveal a bottom surface of the semiconductor chip.

6. The method according to claim 5, further comprising:

mounting a heat sink on the bottom surface of the semiconductor chip.

7. The method according to claim 6, further comprising:

singulating to obtain a plurality of separated IC packages.

* * * * *